United States Patent
Dible et al.

(10) Patent No.: US 6,239,403 B1
(45) Date of Patent: May 29, 2001

(54) POWER SEGMENTED ELECTRODE

(75) Inventors: Robert D. Dible, Fremont; Eric H. Lenz, San Jose; Albert M. Lambson, Milpitas, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/497,234

(22) Filed: Feb. 3, 2000

Related U.S. Application Data

(62) Division of application No. 08/491,349, filed on Jun. 30, 1995, now Pat. No. 6,042,686.

(51) Int. Cl.[7] .................................................. B23K 10/00
(52) U.S. Cl. .................... 219/121.43; 219/121.41; 219/121.52; 156/345; 118/723 I; 204/298.34
(58) Field of Search ....................... 219/121.43, 121.4, 219/121.41, 121.52; 156/345, 643.1, 646.1; 118/723 ER, 723 I, 723 E, 723 MP; 150/345; 204/298.15, 298.06, 298.08, 296.34

(56) References Cited

U.S. PATENT DOCUMENTS

| | | |
|---|---|---|
| 4,184,188 | 1/1980 | Briglia . |
| 4,384,918 | 5/1983 | Abe . |
| 4,464,223 | 8/1984 | Gorin . |
| 4,502,094 | 2/1985 | Lewin et al. . |
| 4,554,611 | 11/1985 | Lewin . |
| 4,579,618 | 4/1986 | Celestino et al. . |
| 4,615,755 | 10/1986 | Tracy et al. . |
| 4,617,079 | 10/1986 | Tracy et al. . |
| 4,633,811 | 1/1987 | Maruyama . |
| 4,665,463 | 5/1987 | Ward et al. . |
| 4,692,836 | 9/1987 | Suzuki . |
| 4,724,910 | 2/1988 | Wicker et al. . |
| 4,885,074 | 12/1989 | Susko et al. . |
| 4,915,978 | 4/1990 | Von Campe et al. . |
| 4,948,458 | 8/1990 | Ogle . |
| 4,962,441 | 10/1990 | Collins . |
| 5,055,964 | 10/1991 | Logan et al. . |
| 5,103,367 | 4/1992 | Horwitz et al. . |
| 5,110,438 | 5/1992 | Ohmi et al. . |
| 5,116,482 | 5/1992 | Setoyama et al. . |
| 5,117,121 | 5/1992 | Watanabe et al. . |
| 5,147,493 | 9/1992 | Nishimura et al. . |
| 5,151,845 | 9/1992 | Watanabe et al. . |
| 5,160,152 | 11/1992 | Toraguchi et al. . |
| 5,179,498 | 1/1993 | Hongoh et al. . |
| 5,191,506 | 3/1993 | Logan et al. . |
| 5,332,880 | 7/1994 | Kubota et al. . |
| 5,350,479 | 9/1994 | Collins et al. . |
| 5,460,684 | 10/1995 | Saeki et al. . |
| 5,463,525 | 10/1995 | Barnes et al. . |
| 5,468,296 | 11/1995 | Patrick et al. . |
| 5,474,648 | 12/1995 | Patrick et al. . |

FOREIGN PATENT DOCUMENTS

| | | |
|---|---|---|
| 4443608 C1 | 12/1994 | (DE) . |
| 0280074 | 8/1988 | (EP) . |
| 0578011 | 1/1994 | (EP) . |
| 58-42226 | 11/1983 | (JP) . |

OTHER PUBLICATIONS

"Electrode Arrangement for Plasma Etching", IBM Technical Disclosure Bulletin, Jun. 1985, pp. 1–3.
Allan W. Scott, "Understanding Microwaves", John Wiley & Sons, Inc. 1993, pp. 3–4, 1993.

*Primary Examiner*—Mark Paschall
(74) *Attorney, Agent, or Firm*—Burns, Doane, Swecker & Mathis, LLP

(57) ABSTRACT

A power segmented electrode useful as part of an upper electrode and/or substrate support for supporting a substrate such as a semiconductor wafer in a plasma reaction chamber such as a single wafer etcher. The power segmented electrode includes a plurality of electrodes which are supplied radiofrequency power in a manner which provides uniform processing of the substrate. The power to the electrodes can be supplied through a circuit incorporating interelectrode gap capacitance, one or more variable capacitors, one or more current sensors, a power splitter, one or more DC biasing sources, and/or power amplifier.

21 Claims, 2 Drawing Sheets

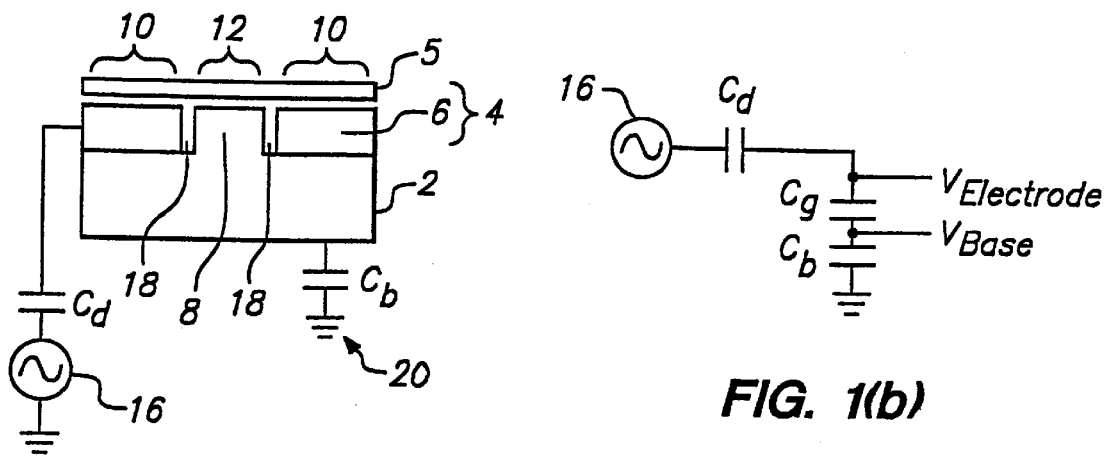
FIG. 1(a)
FIG. 1(b)
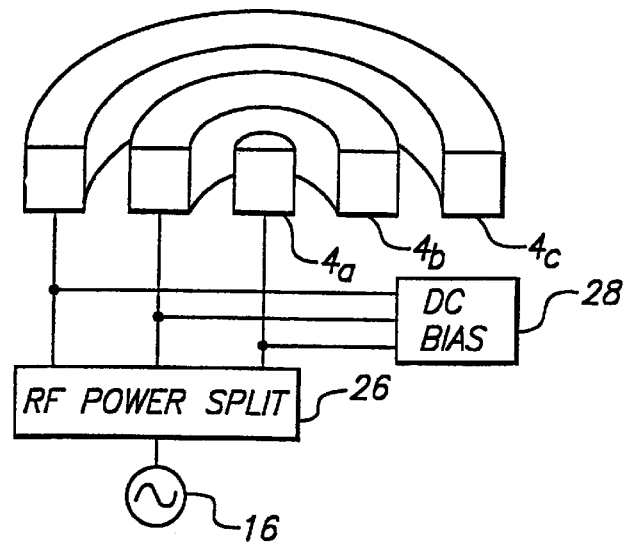
FIG. 2
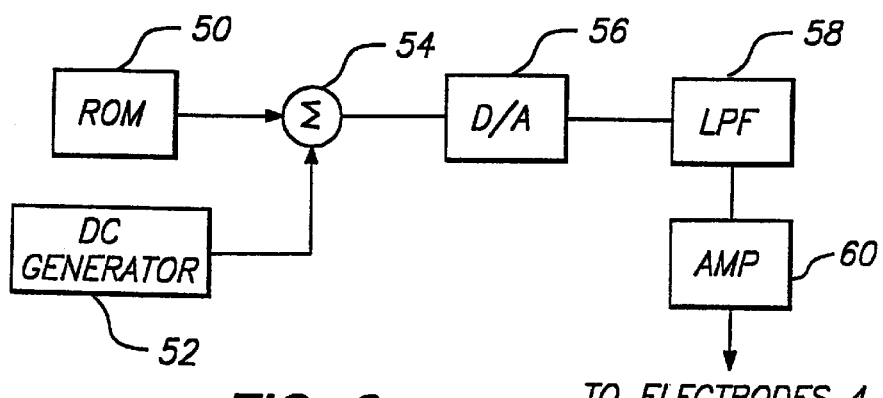
FIG. 3

POWER SEGMENTED ELECTRODE

This application is a divisional of application Ser. No. 08/491,349, filed Jun. 30, 1995 now U.S. Pat No. 6,042,686.

FIELD OF THE INVENTION

The invention relates to an electrode for generating a plasma and/or local plasma density control in a plasma reaction chamber. The electrode can be incorporated in an upper electrode and/or incorporated in a substrate support such as a chucking device for holding a substrate such as a semiconductor wafer, flat panel display, etc., during processing thereof in a plasma gas environment.

BACKGROUND OF THE INVENTION

Equipment for processing semiconductor wafers in a plasma gas environment typically couple radio frequency (RF) power from the plasma gas to the wafer to effect surface treatment of the wafer (e.g., etching, deposition, etc). For instance, U.S. Pat. No. 4,617,079 discloses a parallel plate arrangement wherein a wafer is supported on a lower electrode, RF power from a low frequency generator passes through a low frequency network, RF power from a high frequency generator is combined with the low frequency RF power in a high frequency matching and combining network, and the combined signals are applied across upper and lower electrodes. In this arrangement, the high frequency matching and combining circuit can include a high frequency trap (capacitor and inductor in parallel) tuned to the frequency of the high frequency source for preventing signals generated by the high frequency source from being fed back to the low frequency source but allowing signals generated by the low frequency source to pass therethrough without being attenuated.

U.S. Pat. No. 4,948,458 discloses a parallel plate arrangement wherein the upper electrode is in the form of an electrically conductive coil located outside the plasma reaction chamber and by inducing an RF current in the coil a magnetic field is produced in a planar region parallel to the plane of the coil. The coil is driven by an RF generator which supplies power to a matching circuit having a primary coil and a secondary loop. A variable capacitor in series with the secondary loop adjusts the circuit resonant frequency with the frequency output of the RF generator and impedance matching maximizes efficiency of power transfer to the planar coil. An additional capacitor in the primary circuit cancels part of the inductive reactance of the coil in the circuit.

When processing semiconductor wafers in plasma gas environments, it is desired to uniformly process the entire surface of the wafer. For example, U.S. Pat. No. 4,615,755 discloses a plasma etching technique wherein uniformity of the wafer temperature is achieved by He backcooling of a wafer supported on a bowed electrode. By bowing the wafer away from the lower electrode with the cooling helium, cooling performance of the wafer is sacrificed in order to achieve etch uniformity. However, variations in the thickness of the wafer results in sub-standard control of the wafer bowing and thereby reduces the etch uniformity.

In plasma etching processes which use electrostatic (ESC) wafer clamping systems, the wafer cannot be bowed away from the surface of the electrode to control etch rate uniformity. Accordingly, other techniques are necessary for controlling the uniformity of the wafer surface treatment in plasma processing which are applied to ESC wafer clamping systems.

SUMMARY OF THE INVENTION

The invention provides a power segmented electrode for providing uniform processing of a substrate in a plasma reaction chamber. The power segmented electrode includes first and second electrodes and a capacitive network. The power segmented electrode is attachable to the plasma reaction chamber such that the first electrode is distributed across a first zone of the plasma reaction chamber and the second electrode is distributed across a second zone of the plasma reaction chamber. The capacitive network controls distribution of radio frequency power in the first and second zones such that plasma coupled to a substrate supported in the plasma reaction chamber provides uniform processing across the substrate. In a preferred embodiment, the substrate comprises a semiconductor wafer and the power segmented electrode is incorporated in an electrostatic chuck located in a plasma reaction etching chamber.

The power segmented electrode can be embodied in various ways. For instance, the first electrode can be separated from the second electrode by a gap filled with dielectric material to form an interelectrode capacitor of the capacitive network. In a preferred embodiment, the first electrode surrounds the second electrode and is separated from the second electrode by a gap filled with dielectric material, the gap forming an interelectrode capacitor of the capacitive network. In this case, the first and second capacitors can form part of the capacitive network and radio frequency power from a power source can pass sequentially through the first capacitor, through the first electrode, through the second capacitor, through the second electrode, and to an electrical ground.

According to another embodiment, the first and second electrodes form part of a concentric electrode arrangement comprising a plurality of spaced apart annular electrodese, the electrodes being electrically connected to a radio frequency power source through variable capacitors forming part of the capacitive network and radio frequency power from the power source sequentially passing through each of the variable capacitors and to a respective one of the electrodes. In this case, current sensing mechanisms can be provided for automatically adjusting capacitance of a respective one of the variable capacitors such that adjustment signals emitted therefrom compensate for deviations from uniformity of processing of the substrate in an annular zone of the substrate facing a respective one of the annular electrodes. The capacitive network can comprise first and second capacitors, the first capacitor being connected to the first electrode and the second capacitor being connected to the second electrode, the first and second capacitors being electrically connected in parallel to a radio frequency power source. The power segmented electrode can include a third electrode, the first electrode surrounding the second electrode and the second electrode surrounding the third electrode, each of the electrodes being electrically connected to a radio frequency power source, radio frequency power from the power source passing sequentially through a power splitter and to a respective one of the electrodes. Alternatively, the first electrode can surround only part of the second electrode. The first and second electrodes can be incorporated in an electrostatic chuck and the electrodes can be electrically connected to direct current biasing sources which allow the chuck to electrostatically clamp a substrate on the chuck. The radio frequency power can be supplied in phase or out of phase to the first and second electrodes. Also, a passive network can be used for supplying power and DC bias to the first and second electrodes.

According to another aspect of the invention, the power segmented electrode can include a sine wave generator for generating a numerically sequenced sine wave, a biasing unit for generating a DC offset value, a summation unit for summing the numerically sequenced sine wave and the DC offset value, a digital/analog converter for converting the signal output from the summation unit to an analog summation signal, a low pass filter for filtering predetermined low frequency portions of the analog summation signal, and a power amplifier for amplifying the analog summation signal filtered by the low pass filter and driving the first and second electrodes with the amplified signal. In this case, the first electrode completely surrounds the second electrode and the capacitive network supplies more power to the second electrode than to the first electrode. The first electrode can surround the second electrode and power is supplied to the first and second electrodes by sequentially passing through the first electrode, an interelectrode capacitor formed by a dielectric material disposed in a gap between the first and second electrodes, the second electrode, a series of capacitors forming part of the capacitive network and an electrical ground, the dielectric material providing the interelectrode capacitance to be less than tat of the series of capacitors. The power segmented electrode can further comprise a voltage divider circuit electrically connected to the first electrode or the second electrode. The first electrode can be driven by a first active power driver and the second electrode can be driven by a second active power driver, the first and second power drivers being operated independently of each other.

The invention also provides a plasma processing system comprising a substrate support for clamping a substrate in a plasma reaction chamber of the plasma processing system, the substrate support including a plurality of electrodes associated with zones of the substrate support adjacent to the substrate and a power controller for controlling power supplied to the zones of the substrate support through the plurality of electrodes so that uniform processing is applied across an entire a surface of the substrate. In this case, the power controller includes a capacitive network connected to the plurality of electrodes for distributing power to the zones of the substrate chuck. Adjacent ones of the plurality of electrodes can be separated by gaps, and each of the gaps can be filled with dielectric material to form interelectrode capacitors of the capacitive network. The plurality of electrodes can be segmented into concentric annular rings and or provided in a pattern which compensates for process gas flow in the reaction chamber and provide uniform processing of the substrate.

BRIEF DESCRIPTION OF THE DRAWINGS

The present invention will become more fully understood from the detailed description given hereinbelow and the accompanying drawings which are given by way of illustration only, and thus are not limitative of the present invention, wherein:

FIG. 1(a) illustrates a bipolar type of electrostatic wafer clamping system used in an embodiment of the invention;

FIG. 1(b) illustrates an electrical schematic diagram of the electrostatic wafer clamping system illustrated in FIG. 1(a);

FIG. 2 illustrates an electrode segmented into a plurality of concentric annular rings in an embodiment of the invention;

FIG. 3 illustrates a segmented driving system used for the segmented electrodes in an embodiment of the invention;

DETAILED DESCRIPTION OF THE INVENTION

The invention provides a power segmented electrode of a plasma reaction chamber wherein density of the plasma can be locally enhanced or weakened to achieve desired substrate processing conditions. In the case of a semiconductor wafer, it is typically desired to achieve uniform processing of the exposed surface of the wafer from center to edge thereof. According to the invention, localized control of the plasma density is achieved with a capacitive network which balances RF power such that plasma coupled to the wafer in zones adjacent the exposed surface of the wafer provides uniform wafer processing, e.g., during etching a layer on the wafer or building up a layer on the wafer.

The power segmented electrode according to the invention can be incorporated in a mechanical or electrostatic chucking arrangement for holding a substrate such as a semiconductor wafer during processing thereof. The electrostatic chuck can comprise a bipolar chuck or other type of electrode arrangement. However, the power segmented electrode can also be incorporated in an upper electrode of a parallel plate electrode arrangement of a plasma reaction chamber.

In the case of processing a wafer, it is usually desired to provide a uniform plasma density above the exposed surface of the wafer to be processed. However, depending on the treatment to be performed on the wafer surface, non-uniform plasma density can occur above the wafer surface. For instance, the plasma density may be greater at the wafer center than at the edge thereof or vice versa. The power segmented electrode of the invention can provide local plasma density control and thus achieve substantial improvement in uniformity compared to previously known electrode arrangements.

Figure 5:
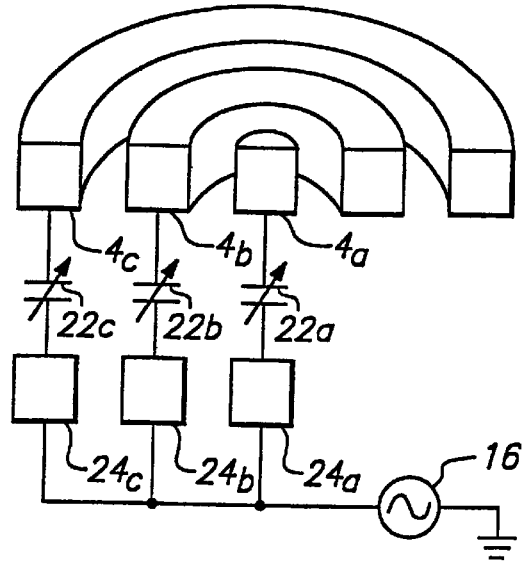
FIG. 5 illustrates an active mechanism for controlling the power delivered to zones of the segmented electrodes in an embodiment of the invention.

The invention will now be described with reference to several embodiments thereof. In one embodiment, the power segmented electrode is incorporated in a bipolar chuck, as shown in FIG. 1(a). In another embodiment, the power segmented electrode includes three or more electrodes, as shown in FIG. 2. In yet another embodiment, the electrodes of the power segmented electrode are arranged in a series and supplied RF power by a single RF power supply, as shown in FIG. 1(a). In another arrangement, the electrodes are arranged in parallel and supplied RF power by a single RF power supply, as shown in FIG. 5. In the latter case, the RF power can be passed through individual variable capacitors, as shown in FIG. 5, or through a power splitter, as shown in FIG. 2. In addition, the electrodes can be electrically connected to current sensors and/or variable capacitors, as shown in FIG. 5.

In the arrangement shown in FIG. 1(a), a substrate S in the form of a semiconductor wafer is supported on a substrate support 2 in the form of a wafer chuck system located in a plasma reaction chamber of a plasma reactor. The chuck system includes electrodes 4 which can be used to locally vary the amount of coupling of plasma to the wafer. The electrodes 4 include a first electrode 6 surrounding a second electrode 8, the first electrode 6 being located in a first zone 10 of the substrate support 2 and the second electrode being located in a second zone 12 of the substrate support 2. The chuck system also includes an RF power source 16 which supplies balanced RF power in the first and second zones 10 and 12. In the embodiment shown, power from the RF power source 16 passes through the first electrode 6, through a gap 18 to the second electrode 8 and then to ground 20. The gap 18 is preferably filled with a dielectric material and the size of the gap 18 is chosen to provide an interelectrode capacitance effective in balancing the RF power between the first and second electrodes 6 and 8 such that plasma coupled to the wafer in the first and second zones 10 and 12 provides uniform processing from center to edge of the wafer.

In this embodiment, a bipolar type of ESC wafer clamping system is illustrated to hold the wafer in a simple donut/base arrangement wherein the electrode is segmented into two zones. In this ESC arrangement, the wafer cannot be bowed away from the lower electrode and the helium can only be used to cool the backside of the wafer. FIG. 1(b) illustrates an electrical schematic diagram of this ESC wafer clamping system. A source capacitance $C_d$ is connected at the input to smooth the power applied to the first electrode 6 and the inherent capacitance between the second electrode 8 and ground is represented by $C_b$. The ratio between the capacitance of gap 18 (represented by $C_g$) and the base capacitance $C_b$ determines the voltage applied to the first and second electrodes 6 and 8. Because the plasma processing is a function of pressure, flow, power, temperature, gap size, gas, baffle design, material, RF frequency, and process latitude, the capacitors in this schematic diagram can be chosen to match the voltage requirements at each zone based on known RF phase and matching requirements. Thereby, the capacitor values are chosen to tailor the fields as desired to achieve plasma processing uniformity.

FIG. 2 illustrates another embodiment of the invention wherein an electrode is segmented into a plurality of concentric annular rings. FIG. 2 illustrates the electrode 4 segmented into first, second, and third concentric annular rings 4a, 4b, and 4c for allowing independent RF bias power zones which control the center-to-edge surface uniformity of the wafer. In this embodiment, the electrode 4 is segmented into three zones. However, any number of concentric annular rings may be used for separating the electrode into zones in order to achieve the desired surface uniformity. The power source 16 may be connected to a power splitter 26 as illustrated in FIG. 2 for controlling the energy applied to each of the zones. Also, FIG. 2 illustrates a DC bias source 28 connected to the concentric annular rings of the electrode for providing electrostatic clamping of the wafer. In addition, the annular zoned electrode controls the power applied to the surface of the wafer so that a symmetrical center-to-edge plasma processing is produced. The RF power and the DC bias delivered to each concentric annular ring of the first electrode 6 can be achieved in a conventional manner by a passive network in conjunction with RF generators and high voltage power supplies.

In another embodiment of the invention the segments of the electrodes can also be driven by a numerically sequenced sine wave combined with a DC offset value as illustrated in FIG. 3. The sequenced sine wave is stored in a ROM 50 and the DC offset value is generated by a voltage source 52 in the embodiment illustrated in FIG. 3. The outputs of the ROM 50 and the voltage generator 52 are summed by a summing circuit 54 and then input to a digital-to-analog converter 56 which outputs an analog signal. The analog signal output from the digital-to-analog converter 56 is low pass filtered by a low pass filter 58 and then the filtered signal output is amplified by a power amplifier 60 and applied to the segmented electrodes 4a, 4b, and 4c.

Figure 4:
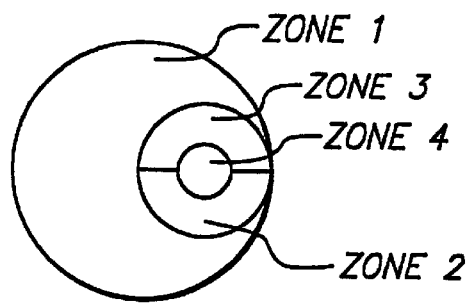
FIG. 4 illustrates an asymmetrical pattern of segmented electrodes used in an embodiment of the invention.

The electrodes may also be segmented into other patterns as desired to achieve processing uniformity requirements, and FIG. 4 illustrates another embodiment where an asymmetrical pattern of segmented electrodes is used. In the embodiment illustrated in FIG. 4, the electrode is segmented into four zones. However, the electrodes can be designed to provide a pattern which compensates for the chamber geometry, gas delivery, or asymmetrical pumping of the plasma processing system.

FIG. 5 illustrates another embodiment of the invention wherein an active mechanism is used to control the power delivered to different zones of electrodes. FIG. 5 illustrates a plurality of current sensors 24 and a plurality of variable capacitors 22 connected to the segmented electrodes. The current sensors 24 provide active control of the variable capacitors 22. This active mechanism is used to control the percentage of power sent to the electrode zones by a feedback loop through the current sensors 24 to the variable capacitors 22.

Figure 6:
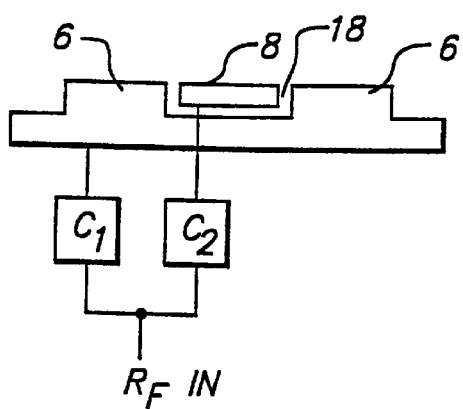
FIG. 6 illustrates a system for simultaneously coupling RF energy into both poles of an electrostatic wafer clamping system in an embodiment of the invention.

FIG. 6 illustrates another embodiment of the invention where two variable capacitors C1 and C2 are used to simultaneously couple RF energy into both poles of an ESC wafer clamping system. This embodiment helps to prevent any phase shift and charge imbalance across the portions of the chuck.

Figure 7:
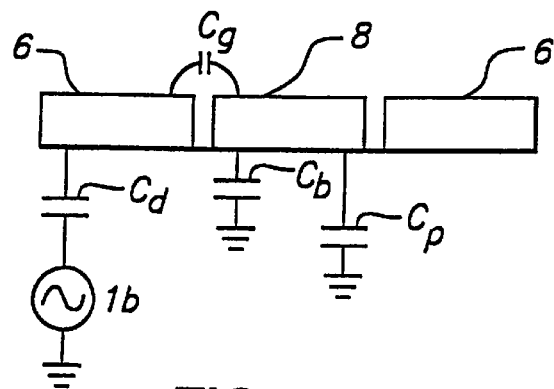
FIG. 7 illustrates a voltage divider circuit and a capacitor network used to balance and adjust the RF voltage applied to the chuck surface in an embodiment of the invention.

FIG. 7 illustrates another embodiment of the invention where a voltage divider circuit and a capacitor network balance and adjust the RF voltage applied to the chuck surface. In this embodiment, a parallel capacitance $C_p$ to the base capacitance is varied to set up the voltage divider. The capacitance value is selected by running uniformity tests on patterned and unpatterned oxide wafers and comparing the numerical data and diameter scans for result verification. Compared to prior art arrangements wherein wafer process uniformity (i.e., center-to-edge) was typically 5%, the power segmented electrode according to the invention provides significant improvement in that wafer process uniformities of 1.5% or even lower can be achieved.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method for processing substrates in a plasma processing system, comprising the steps of:
    (a) clamping a substrate to a substrate support in a plasma reaction chamber;
    (b) generating plasma in the plasma reaction chamber with a power segmented electrode having a plurality of electrodes associated with zones of the substrate, the power segmented electrode being incorporated in the substrate support; and
    (c) controlling distribution of power supplied to the electrodes so that uniform processing is applied across a surface of the substrate to be processed.

2. The method according to claim 1, wherein step (c) distributes the power to the zones of the substrate by a capacitive network connected to the plurality of electrodes.

3. The method according to claim 2, wherein adjacent ones of the plurality of electrodes are separated by gaps, and each of the gaps are filled with dielectric material to form interelectrode capacitors of the capacitive network.

4. The method according to claim 1, wherein the plurality of electrodes are segmented into concentric annular rings.

5. The method according to claim 1, wherein the plurality of electrodes are provided in a pattern which compensates for process gas flow in the reaction chamber and provide uniform processing across a surface of the substrate.

6. The method of claim 1, wherein the substrate is a single semiconductor wafer.

7. The method of claim 1, wherein the substrate support is an electrostatic chuck.

8. The method of claim 1, wherein the plurality of electrodes includes a first electrode separated from a second electrode by a gap, the gap being filled with dielectric material and forming an interelectrode capacitor of a capacitive network.

9. The method of claim 1, wherein the plurality of electrodes includes a first electrode surrounding a second electrode and separated from the second electrode by a gap filled with dielectric material, the gap forming an interelectrode capacitor of a capacitive network.

10. The method of claim 1, wherein the plurality of electrodes includes first and second electrodes and the power segmented electrode further comprises a radio frequency power source, first and second capacitors forming part of a capacitive network and an electrical ground, radio frequency power from the power source passing sequentially through the first capacitor, through the first electrode, through the second capacitor, through the second electrode, and to the electrical ground.

11. The method of claim 1, wherein the plasma reaction chamber comprises a plasma reaction etching chamber.

12. The method of claim 1, wherein the plurality of electrodes includes first and second electrodes which form part of a concentric electrode arrangement comprising a plurality of spaced apart annular electrodes, the electrodes being electrically connected to a radio frequency power source through variable capacitors forming part of the capacitive network and radio frequency power from the power source sequentially passing through each of the variable capacitors and to a respective one of the electrodes.

13. The method of claim 1, wherein the plurality of electrodes comprises concentric annular electrodes and current sensing mechanisms automatically adjust capacitance of variable capacitors such that adjustment signals emitted therefrom compensate for deviations from uniformity of processing of the substrate in an annular zone of the substrate facing a respective one of the annular electrodes.

14. The method of claim 1, wherein the plurality of electrodes comprises first and second electrodes and a first capacitor is connected to the first electrode and a second capacitor is connected to the second electrode, the first and second capacitors being electrically connected in parallel to a radio frequency power source.

15. The method of claim 1, wherein the plurality of electrodes comprises first, second and third electrodes, the first electrode surrounding the second electrode and the second electrode surrounding the third electrode, each of the electrodes being electrically connected to a radio frequency power source, radio frequency power from the power source passing sequentially through a power splitter and a respective one of the electrodes.

16. The method of claim 1, wherein the plurality of electrodes includes first and second electrodes, the first electrode surrounding only part of the second electrode.

17. The method of claim 1, wherein the plurality of electrodes comprises first and second electrodes electrically connected to direct current biasing sources which allow the substrate support to electrostatically clamp the substrate thereon.

18. The method of claim 1, wherein the plurality of electrodes comprises first and second electrodes, a source of radio frequency power being supplied in phase or out of phase to the first and second electrodes.

19. The method of claim 1, wherein the plurality of electrodes comprises first and second electrodes, the method including using a passive network supplying power and DC bias to the first and second electrodes.

20. The method of claim 1, wherein the plurality of electrodes comprises first and second electrodes, a voltage divider circuit being electrically connected to the first electrode or the second electrode.

21. The method of claim 1, wherein the plurality of electrodes comprises first and second electrodes, the first electrode being driven by a first active power driver and the second electrode being driven by a second active power driver, the first and second power drivers being operated independently of each other.

* * * * *